United States Patent
Stegmeier

(10) Patent No.: US 10,741,474 B2
(45) Date of Patent: Aug. 11, 2020

(54) COMPONENT MODULE AND POWER MODULE

(71) Applicant: SIEMENS AKTIENGESELLSCHAFT, München (DE)

(72) Inventor: Stefan Stegmeier, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 15/750,150

(22) PCT Filed: Aug. 2, 2016

(86) PCT No.: PCT/EP2016/068394
§ 371 (c)(1),
(2) Date: Jul. 2, 2018

(87) PCT Pub. No.: WO2017/021394
PCT Pub. Date: Feb. 9, 2017

(65) Prior Publication Data
US 2018/0301392 A1    Oct. 18, 2018

(30) Foreign Application Priority Data

Aug. 5, 2015    (DE) .......................... 10 2015 215 928

(51) Int. Cl.
*H01L 23/427*    (2006.01)
*H01L 23/467*    (2006.01)
(Continued)

(52) U.S. Cl.
CPC ........ *H01L 23/427* (2013.01); *H01L 23/3733* (2013.01); *H01L 23/3735* (2013.01);
(Continued)

(58) Field of Classification Search
CPC ... H01L 23/427; H01L 23/3733; H01L 24/37; H01L 23/467; H01L 23/3736;
(Continued)

(56) References Cited

U.S. PATENT DOCUMENTS 5,402,004 A * 3/1995 Ozmat .................. H01L 23/147
257/717
5,847,927 A * 12/1998 Minning ............... F28F 13/003
361/696

(Continued)

FOREIGN PATENT DOCUMENTS

CN    102646653 A    8/2012
DE    10055454 A1    5/2002
(Continued)

OTHER PUBLICATIONS

PCT International Search Report and Written Opinion of International Searching Authority dated Oct. 12, 2016 corresponding to PCT International Application No. PCT/EP2016/068394 filed Aug. 2, 2016.

(Continued)

*Primary Examiner* — Adam B Dravininkas
(74) *Attorney, Agent, or Firm* — Lempia Summerfield Katz LLC

(57) ABSTRACT

The disclosed component module includes a component comprising at least one electric contact to which at least one porous contact piece is connected; the component module further includes a cooling system for fluid-based cooling, said cooling system comprising one or more cooling ducts which are formed by pores of the porous contact piece. The disclosed power module comprises a component module of said type.

17 Claims, 2 Drawing Sheets

(51) Int. Cl.
*H01L 23/373* (2006.01)
*H01L 23/00* (2006.01)

(52) U.S. Cl.
CPC ........ *H01L 23/3736* (2013.01); *H01L 23/467* (2013.01); *H01L 24/37* (2013.01); *H01L 2224/13939* (2013.01); *H01L 2224/37211* (2013.01); *H01L 2224/37239* (2013.01); *H01L 2224/37244* (2013.01); *H01L 2224/37247* (2013.01); *H01L 2224/37255* (2013.01); *H01L 2224/37395* (2013.01); *H01L 2924/1203* (2013.01); *H01L 2924/13055* (2013.01); *H01L 2924/13091* (2013.01)

(58) Field of Classification Search
CPC ....... H01L 23/3735; H01L 2224/37255; H01L 2224/37395; H01L 2224/37247; H01L 2224/37244; H01L 2224/37239; H01L 2224/37211; H01L 2224/13939
See application file for complete search history.

(56) References Cited

U.S. PATENT DOCUMENTS

| | | | |
|---|---|---|---|
| 2005/0103480 A1* | 5/2005 | Pokharna | H01L 23/427 165/122 |
| 2012/0211213 A1 | 8/2012 | Kitajima | |
| 2013/0329365 A1* | 12/2013 | Hosseini | F28D 15/02 361/699 |

FOREIGN PATENT DOCUMENTS

| | | | |
|---|---|---|---|
| DE | 10221138 A1 | 2/2004 | |
| DE | 10244805 A1 | 4/2004 | |
| DE | 102013105995 A1 | 12/2013 | |
| EP | 1130643 A2 | 9/2001 | |
| FR | 2760593 A1 | 9/1998 | |
| JP | 2004006603 | 1/2004 | |
| JP | 2005057130 A | 3/2005 | |
| JP | 2005123265 A | 5/2005 | |
| JP | 2006352080 | 12/2006 | |
| JP | 2008028163 A | 2/2008 | |
| JP | 2012174856 A | 9/2012 | |
| JP | 2013197560 A | 9/2013 | |
| WO | WO-2015086184 A1 * | 6/2015 | ........... H01L 23/473 |
| WO | WO2015086184 A1 | 6/2015 | |

OTHER PUBLICATIONS

German Office Action for German Application No. 102015214928.5, dated Apr. 22, 2016.
Japanese Office Action for Japanese Patent Application No. 2018-504906, dated Feb. 25, 2019, with English translation.
Chinese Office Action for Chinese Application No. 2016800459645 dated Oct. 9, 2019.

* cited by examiner

COMPONENT MODULE AND POWER MODULE

This application is the National Stage of International Application No. PCT/EP2016/068394, filed Aug. 2, 2016, which claims the benefit of German Patent Application No. 10 2015 214 928.5, filed Aug. 5, 2015. The entire contents of these documents are hereby incorporated herein by reference.

BACKGROUND

The present embodiments relate to a component module and a power module.

In electronics (e.g., in power electronics), the switching and conducting of currents in semiconductor component parts (e.g., IGBTs, diodes, MOSFETs, etc.) cause power losses. Such power losses are to be absorbed by a cooler so that such semiconductor component parts do not heat up and efficient operation is provided. It is known to apply power component parts to the underside of a substrate (DCB, AMB, etc.) by shrink-hole-free soldering, diffusion soldering, or sintering. The substrate is connected in planar fashion to a cooler. However, the cooling is often not efficient. The resulting heating of such power component parts regularly results in an increased failure rate of the power component parts and premature failure of insulation material because of thermal degradation. Cooling of power component parts on the top side is often particularly difficult because a material is potted for electrical insulation because of the wire-bonding or ribbon-bonding technology that is often used, which prevents the dissipation of thermal energy.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a component module and a power module in which the cooling of component parts is improved are provided.

The component module has a component having at least one electrical contact. In the component module, at least one open-pore contact piece is connected to the at least one contact for electrical contact-connection. The component module also has a cooling system for cooling the component using a cooling fluid. The cooling system includes one or more cooling ducts that are formed by pores of the open-pore contact piece.

In accordance with one or more of the present embodiments, the open-pore contact piece does not therefore function solely for the purpose of electrical contact-connection, but the contact piece also makes thermal contact with a cooling fluid possible. In this way, heat may be dissipated directly at the component, with the result that the heat is dissipated particularly efficiently. For example, the heat does not have to be dissipated over several layers, with the result that the thermal conductivity of such layers does not limit the possible heat dissipation. Instead, in the component module according to one or more of the present embodiments, the heat is dissipated by the cooling fluid in arbitrary spatial proximity to the component. As a result of the efficient dissipation of heat, the fail-safety of the component module and the wear resistance of possibly present insulation materials are significantly increased.

In the component module according to one or more of the present embodiments, the contact piece may be connected to the at least one contact of the component electrically and/or by sintering and/or by soldering and/or by diffusion soldering and/or by pressing and/or by clamping and/or by adhesive bonding. In the component module according to one or more of the present embodiments, the mentioned methods simultaneously provide particularly good electrical contact and particularly good thermal contact for the purpose of heat dissipation through the contact piece. In the component module according to one or more of the present embodiments, the component is an integrated circuit. In the case of integrated circuits, efficient dissipation of heat is particularly important for operation. In this development, the efficient dissipation of heat that is possible is advantageous as a result. In a development of the component module, the component module has at least two or more components that are each connected to a common printed circuit board by an open-pore contact piece. In this development, the heat may be dissipated locally at each component directly, which significantly increases the fail-safety of the component module.

In the component module according to one or more of the present embodiments, the at least one open-pore contact piece is suitably formed from or by metal (e.g., nickel and/or silver and/or gold and/or tin and/or copper, a metal sponge such as a copper sponge). In this development of the component module, the open-pore contact piece is easily configured in an electrically conductive manner as an electrical contact piece. The mentioned materials permit an open-pore configuration at the same time.

In the component module according to one or more of the present embodiments, the at least one open-pore contact piece may be formed by a fabric-like and/or foam-like and/or mesh-like structure (e.g., a structure formed as a metal mesh). Alternatively or in addition, the open-pore contact piece may be formed by a stack of leadframes. In this development, the open porosity of the contact piece may be easily provided.

The term "open-pore" may be understood in the context of this application as being that pores of the contact piece form inlets on the surface of the contact piece, through which inlets fluid, such as a cooling fluid, may permeate into the contact piece from the outside. Ideally, the open-pore material of the contact piece also has an open-cell structure, through which cooling fluid may pass efficiently (e.g., such that the cooling fluid flows through the contact piece).

In the component module according to one or more of the present embodiments, the open-pore contact piece may be suitable for conducting cooling fluid (e.g., cooling liquid) through the pores of the contact piece.

In one embodiment, in the component module, the cooling system includes a heat pipe. A particularly efficient cooling circuit is realized by a heat pipe.

The power module according to one or more of the present embodiments includes a component module as described above. In the power module, the at least one component may be a power component. In power modules, the problem of efficient heat dissipation arises increasingly, since in this case, there is a particularly large amount of energy to convert to thermal energy. In the power module according to one or more of the present embodiments, the efficient dissipation of heat that is possible in the component module is consequently a great advantage.

DETAILED DESCRIPTION

Figure 1:
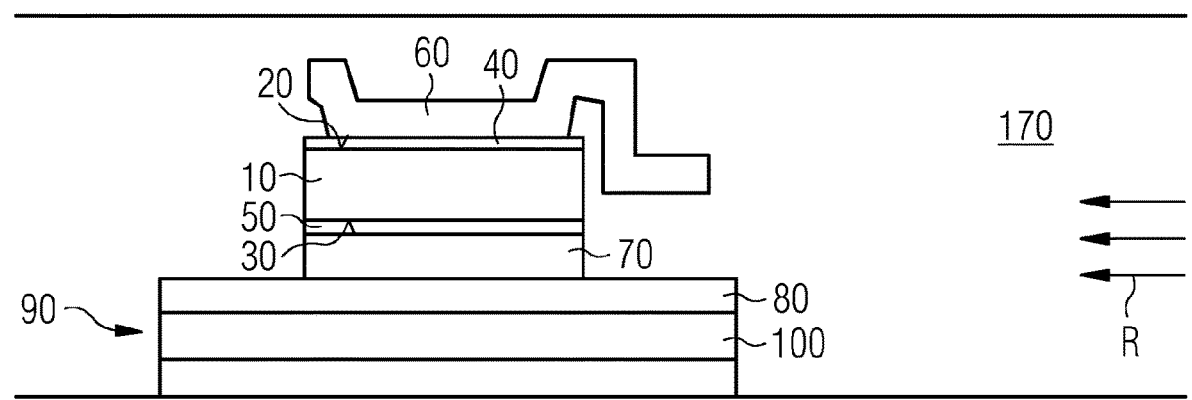
FIG. 1 shows a schematic longitudinal section of a first exemplary embodiment of a power module having a component module having a cooling system realized by an open-pore contact piece of the component module.

The power component 10 illustrated in FIG. 1 is an insulated-gate bipolar transistor (IGBT) and has a first flat side 20 and a second flat side 30 that face away from one another. Thin-film-like surface contacts 40, 50 of the power component 10, which are configured as two-dimensional chip metalizations, extend along the first flat side 20 and the second flat side 30. In the exemplary embodiment illustrated, the surface contact 40 of the power component, the surface contact being arranged on the top side in FIG. 1, consists of copper, while the surface contact 50 of the power component, the surface contact being arranged on the underside, consists of silver. Top-side surface contacts 40 may also be formed from or by silver or from or by AlSiCu, other metals, or other electrically conductive materials, while the underside surface contacts 50 may also be formed from or by gold and/or other metals or other electrically conductive materials.

For contact-connecting these surface contacts 40, 50, contact pieces 60, 70 of open-pore material are placed in bearing fashion on the surface contacts 40, 50, the contact pieces extending substantially in planar fashion along the surface contacts 40, 50. In the exemplary embodiment illustrated, the contact pieces 60, 70 are configured to be conductive and realized as copper sponges. In other exemplary embodiments, not shown separately, which otherwise correspond to the exemplary embodiments explained with reference to the figures, the open-pore contact pieces 60, 70 may also consist of other open-pore conductive materials, such as aluminum or titanium contact pieces formed from fabrics or meshes or other porous structures or contact pieces formed from or by other metals. For example, polymer sponges partially coated with conductive materials or packed with conductive particles may also be used as contact pieces. In further exemplary embodiments, which otherwise correspond to the exemplary embodiments illustrated, the open-pore contact piece may be formed by a stack of leadframes.

One of the surface contacts 50 of the power component 10 faces toward a further surface contact 80 of a ceramic substrate 90 having a ceramic core 100 made of aluminum nitride (AlN). In further exemplary embodiments, not shown separately, the ceramic core 100 may consist, in principle, of another material (e.g., another ceramic material or a polymer such as PCB or FR4). The further surface contact 80 of the ceramic substrate 90 is configured as a superficial substrate metalization (e.g., in the exemplary embodiment illustrated, as a copper substrate metalization). The surface contact 50 of the power component 10, the surface contact facing the ceramic substrate 90, and the further surface contact 80 of the ceramic substrate 90 extend in parallel with one another and thus form a gap. That contact piece 70 arranged at that surface contact 50 facing the ceramic substrate 90 fills the planar gap completely, and the full surface of the contact piece bears on the surface contact 50 of the power component 10 and on the further surface contact 80 of the ceramic substrate 90. The contact piece 70 is thus arranged for the contact-connection of the power component 10 and the ceramic substrate 90.

The open-pore contact pieces 60, 70 are electrically contact-connected to the respective substrate or chip metalizations and thus produce an electrically conductive connection between the respective surface contacts 40, 50, 80 as a result of the continuously conductive metallic contact The surface contacts 40, 50, 80 are electrically isolated from one another and from possibly further electrical potentials located in the surroundings thereof by virtue of the fact that the surface contacts 40, 50, 80 are covered with an electrical insulation material (e.g., in the exemplary embodiment described here, with a plastic) in the surface regions in which there is no contact piece 60, 70 (not explicitly illustrated in the figures).

Figure 3:
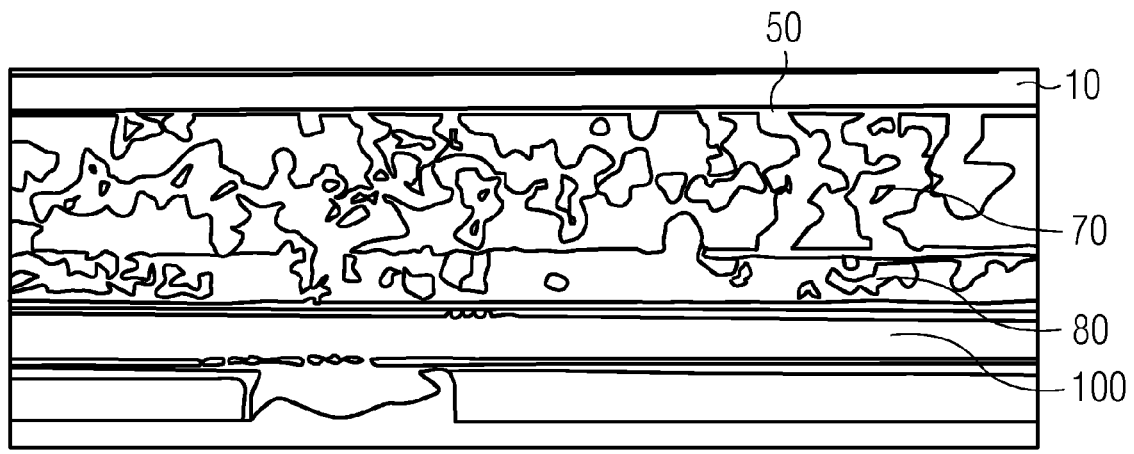
FIG. 3 shows a longitudinal section of a basic outline of a detail of the connection of the open-pore contact piece of the exemplary embodiments in accordance with FIGS. 1 and 2.

As a result of the electrical connection of the open-pore contact pieces 60, 70, metal (e.g., in the exemplary embodiment illustrated, copper) is deposited in the region between the open-pore contact pieces 60, 70 and the surface contacts 40, 50, 80 (FIG. 3). In the exemplary embodiment illustrated, layers are formed by the deposited material. The layers extend in planar fashion along the chip metalizations or ceramic substrate metalizations and along the contact pieces 60, 70. As a result of this depositing, the open-pore contact pieces 60, 70 are each connected to the power component. All the contact pieces 60, 70 are connected at the same time to the respective surface contacts 40, 50, 80 on which the contact pieces 60, 70 respectively bear. In further exemplary embodiments, not shown separately, which otherwise correspond to the exemplary embodiment illustrated, the contact pieces are not connected electrically but by sintering or soldering or diffusion soldering or pressing or clamping or adhesive bonding.

The power modules formed by the ceramic substrate 90 and the contact-connected power component 10 are arranged in a fluid flow path 170 of a cooling system of the power module (FIG. 1). The cooling system of the power module is configured to conduct cooling fluid along a direction R through the fluid flow path 170. In the exemplary embodiment illustrated, the fluid flow path 170 is an air flow path. In further exemplary embodiments, not illustrated separately, which otherwise correspond to those illustrated, another fluid flow (e.g., a cooling gas flow or a cooling liquid flow such as a cooling water flow) is provided for the purpose of cooling. The cooling fluid may pass in the fluid flow path 170 through the open-pore contact piece 70 such that the open-pore material of the contact piece 70 forms cooling ducts. In further exemplary embodiments, not illustrated separately, a cooling fluid does not have to be actively streamed by an additionally provided flow device. Instead, a fluid flow may even be formed automatically as a result of heat convection.

Figure 2:
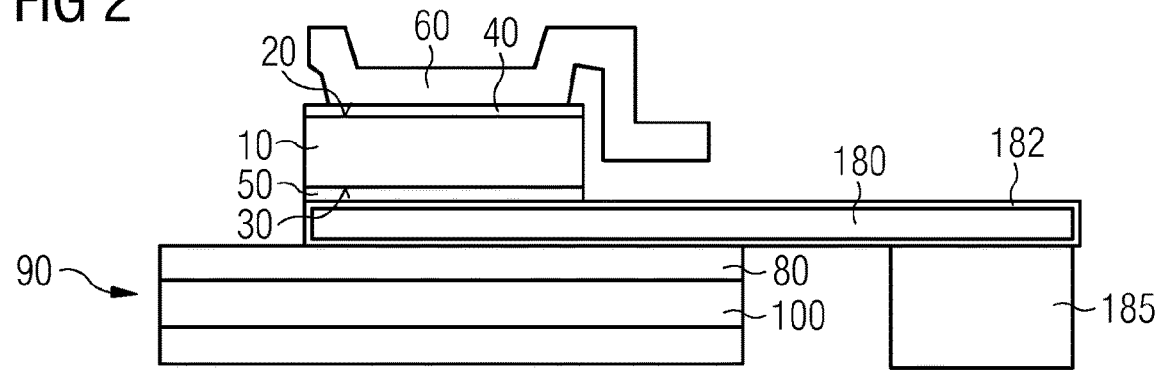
FIG. 2 shows a schematic longitudinal section of a second exemplary embodiment of a power module having a component module having a heat pipe formed by an open-pore contact piece of the component module.

In a further exemplary embodiment illustrated in FIG. 2, which otherwise corresponds to the exemplary embodiment illustrated in FIG. 1, a heat pipe 180 is provided instead of an air flow of a cooling circuit. The heat pipe 180 is formed by the contact piece 70 arranged between the power component 10 and the ceramic substrate 90. The heat pipe 180 is formed by the open-pore contact piece 70. The open-pore material forms the interior of the heat pipe 180. As a result of the open porosity of the material of the contact piece 70, the cooling fluid may flow through the heat pipe 180. The heat pipe 180 also has a fluid-tight enclosure 182. This enclosure 182 is applied over the external circumference (e.g., electrically or by plating or soldering), such that the cooling fluid is fed through the heat pipe 180 without losses.

The heat pipe 180 forms in this case a cooling circuit for a cooling liquid, where heat is absorbed and emitted by the heat pipe as a result of evaporation and condensation. For this purpose, the heat pipe 180 is connected, with an end that is remote from the power component 10 to a heatsink 185, with the result that the cooling liquid condenses at this remote end of the heat pipe 180.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A component module comprising:
   a heat generating power component directly connected to at least one electrical contact, the at least one electrical contact being an electrically conductive film-like layer, in which a first surface of an open-pore electrical contact piece is connected to the at least one electrical contact and a second surface of the open-pore electrical contact piece opposite the first surface is connected to a substrate, such that there are no heat generating devices disposed between the second surface of the open-pore electrical contact piece and the substrate, wherein the open-pore electrical contact piece is formed by a fabric-like structure, a foam-like structure, a mesh-like structure, stacked leadframes, or any combination thereof; and
   a cooling system for cooling using a cooling fluid, the cooling system comprising one or more cooling ducts that are formed by pores of the open-pore electrical contact piece.

2. The component module of claim 1, wherein the open-pore electrical contact piece is connected electrically, by sintering, by soldering, by diffusion soldering, by pressing, by clamping, by adhesive bonding, or any combination thereof.

3. The component module of claim 1, further comprising at least one integrated circuit, wherein the open-pore electrical contact piece is connected to the at least one integrated circuit.

4. The component module of claim 1, further comprising a printed circuit board that has at least two or more components each jointly connected to the printed circuit board by an open-pore electrical contact piece.

5. The component module of claim 1, wherein the open-pore electrical contact piece is formed from or by metal.

6. The component module of claim 5, wherein the metal is nickel, silver, gold, tin, copper, or any combination thereof.

7. The component module of claim 1, wherein the cooling fluid is formed by water, another cooling liquid, or water and the other cooling liquid.

8. The component module of claim 1, wherein the cooling system comprises a heat pipe.

9. A power module comprising:
   a component module comprising:
      a heat generating power component directly connected to at least one electrical contact, the at least one electrical contact being an electrically conductive film-like layer, in which a first surface of an open-pore electrical contact piece is connected to the at least one electrical contact and a second surface of the open-pore electrical contact piece opposite the first surface is connected to a substrate, such that there are no heat generating devices disposed between the second surface of the open-pore electrical contact piece and the substrate, wherein the open-pore electrical contact piece is formed by a fabric-like structure, a foam-like structure, a mesh-like structure, stacked leadframes, or any combination thereof; and
      a cooling system for cooling using a cooling fluid, the cooling system comprising one or more cooling ducts that are formed by pores of the open-pore electrical contact piece.

10. The power module of claim 9, wherein the at least one component is a power component.

11. The power module of claim 9, wherein the open-pore electrical contact piece is connected electrically, by sintering, by soldering, by diffusion soldering, by pressing, by clamping, by adhesive bonding, or any combination thereof.

12. The power module of claim 9, wherein the component module further comprises at least one integrated circuit, wherein the open-pore electrical contact piece is connected to the at least one integrated circuit.

13. The power module of claim 9, wherein the component module further comprises a printed circuit board that has at least two or more components each jointly connected to the printed circuit board by an open-pore electrical contact piece.

14. The power module of claim 9, wherein the open-pore electrical contact piece is formed from or by metal.

15. The component module of claim 14, wherein the metal is a copper sponge.

16. The power module of claim 9, wherein the cooling fluid is formed by water, another cooling liquid, or water and the other cooling liquid.

17. The power module of claim 9, wherein the cooling system comprises a heat pipe.

* * * * *